(12) United States Patent
Kim et al.

(10) Patent No.: US 7,749,787 B2
(45) Date of Patent: Jul. 6, 2010

(54) METHOD FOR FORMING QUANTUM DOTS BY ALTERNATE GROWTH PROCESS

(75) Inventors: Jin Soo Kim, Daejeon (KR); Jin Hong Lee, Daejeon (KR); Sung Ui Hong, Daejeon (KR); Byung Seok Choi, Daejeon (KR); Ho Sang Kwack, Daejeon (KR); Dae Kon Oh, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 806 days.

(21) Appl. No.: 11/272,617

(22) Filed: Nov. 14, 2005

(65) Prior Publication Data

US 2006/0222027 A1 Oct. 5, 2006

(30) Foreign Application Priority Data

Dec. 8, 2004 (KR) ........................ 10-2004-0103067
Sep. 13, 2005 (KR) ........................ 10-2005-0085194

(51) Int. Cl.
*H01L 21/00* (2006.01)

(52) U.S. Cl. ............... 438/48; 438/94; 438/962; 257/E21.085

(58) Field of Classification Search ............... 438/47, 438/94, 962; 257/E21.085; 372/44.011, 372/45.012

See application file for complete search history.

(56) References Cited

U.S. PATENT DOCUMENTS

| 5,614,435 | A  | * | 3/1997  | Petroff et al. | ............... 117/85 |
| 6,600,169 | B2 | * | 7/2003  | Stintz et al.  | ............... 257/14 |
| 7,015,498 | B2 | * | 3/2006  | Ebe et al.     | ............... 257/14 |
| 2005/0227386 | A1 | * | 10/2005 | Jones et al.   | ............... 438/22 |

* cited by examiner

*Primary Examiner*—Lex Malsawma
(74) *Attorney, Agent, or Firm*—Ladas & Parry LLP

(57) ABSTRACT

Provided is a method of forming quantum dots, including: forming a buffer layer on an InP substrate so as to be lattice-matched with the InP substrate; and sequentially alternately depositing In(Ga)As layers and InAl(Ga)As or In(Ga, Al, As)P layers that are greatly lattice-mismatched with each other on the buffer layer so as to form In(Ga, Al)As or In(Ga, Al, P)As quantum dots.

23 Claims, 6 Drawing Sheets

METHOD FOR FORMING QUANTUM DOTS BY ALTERNATE GROWTH PROCESS

CROSS-REFERENCE TO RELATED PATENT APPLICATION

This application claims the benefit of Korean Patent Application Nos. 10-2004-0103067, filed on Dec. 8, 2004 and 10-2005-0085194, filed on Sep. 13, 2005, in the Korean Intellectual Property Office, the disclosure of which is incorporated herein in its entirety by reference.

BACKGROUND OF THE INVENTION

1. Field of the Invention

The present invention relates to a method for forming quantum dots, and more particularly, to a method for forming quantum dots usable as an active layer of a photonic device such as a laser diode or a photodetector.

2. Description of the Related Art

There have been variously studied on a Stranski-Krastanow growth method for growing self-assembled quantum dots using a strain relaxation process of a lattice-mismatch without an additional lithography process. In addition, there have been made various studies on applications of the self-assembled quantum dots formed by the Stranski-Krastanow growth method to photonic devices.

In particular, studies on applications of the self assembled quantum dots in optical communications using a wavelength between 1.3 μm and 1.55 μm have been briskly made. In(Ga)As quantum dots may be taken as an example of quantum dots used in a wavelength of 1.3 μm. The In(Ga)As quantum dots may be grown from a GaAs substrate using a self assembled method. Thus, many results of studies on laser diodes and photonic devices using the In(Ga)As quantum dots formed by the self-assembled method as active layers have been announced.

However, in a case where In(Ga)As quantum dots are formed on a GaAs substrate so as to be used in a wavelength of 1.55 μm, there is a limit to realizing the wavelength of 1.55 μm due to sizes of the In(Ga)As quantum dots and effects of strains of peripheral materials. Thus, active studies on forming of In(Ga)As quantum dots used in a wavelength of 1.55 μm on an InP substrate have been made.

However, in a case where the InP substrate is used, a lattice mismatch between the InP substrate and a material for forming quantum dots is lower than when a GaAs substrate is used. Also, it is highly difficult to form high-quality quantum dots using a self-assembled method due to a reaction of the InP substrate with peripheral materials. Moreover, In(Ga)As quantum dots formed on the InP substrate are asymmetric or non-uniform. Thus, a full-width at half-maximum (FWHM) of a photoluminescence peak is highly wide, and an intensity of the photoluminescence peak is weak. As a result, many problems occur in the use of the In(Ga)As quantum dots as an active layer of a photonic device.

SUMMARY OF THE INVENTION

The present invention provides a method for forming highly uniform quantum dots on an InP substrate to obtain a photoluminescence characteristic having a narrow FWHM and a great intensity of a photoluminescence peak.

According to an aspect of the present invention, there is provided a method for forming quantum dots, including: forming a buffer layer on an InP substrate so as to be lattice-matched with the InP substrate; and sequentially alternately depositing In(Ga)As layers and InAl(Ga)As or In(Ga, Al, As)P layers that are greatly lattice-mismatched with each other on the buffer layer so as to form In(Ga, Al)As or In(Ga, Al, P)As quantum dots. If In(Ga)As layers and InAl(Ga)As layers are alternately deposited, In(Ga, Al)As quantum dots may be formed. If In(Ga)As layers and In(Ga, Al, As)P layers are alternately deposited, In(Ga, Al, P)As quantum dots may be formed.

According to another aspect of the present invention, there is provided a method for forming quantum dots, including: forming a buffer layer on an InP substrate so as to be lattice-matched with the InP substrate; and sequentially alternately depositing In(Ga)As layers and InAl(Ga)As layers that are greatly lattice-mismatched with each other on the buffer layer so as to form In(Ga, Al)As quantum dots using a self assembled method using the lattice-mismatch between the In(Ga)As layers and the InAl(Ga)As layers and a phase separation caused by a growth behavior of a III-group material for constituting the In(Ga)As layers and the InAl(Ga)As layers.

According to still another aspect of the present invention, there is provided a method for forming quantum dots, including: forming a buffer layer on an InP substrate so as to be lattice-matched with the InP substrate; and sequentially alternately depositing In(Ga)As layers and In(Ga, Al, As)P layers that are greatly lattice-mismatched with each other on the buffer layer so as to form In(Ga, Al)As quantum dots using a self assembled method using the lattice-mismatch between the In(Ga)As layers and the In(Ga, Al, As)P layers and a substitution between As and P occurring during the alternate deposition of the In(Ga)As layers and the In(Ga, Al, As)P layers.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
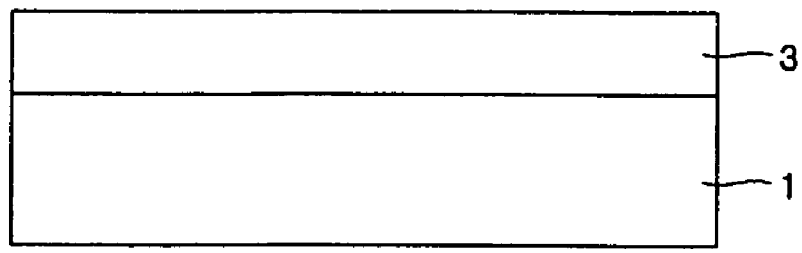
FIGS. 1 through 4 are cross-sectional views illustrating a method for forming quantum dots according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present In the present specification, a material marked with "( )" may be included or not. For example, in a case where an In(Ga)As layer is expressed, the In(Ga)As layer may be an InAs layer or an InGaAs layer.

FIGS. 1 through 4 are cross-sectional views illustrating a method for forming quantum dots according to an embodiment of the present invention.

Referring to FIG. 1, an InP substrate 1 is annealed in an atmosphere of arsenic (As). A buffer layer 3 is formed on the InP substrate 1 so as to be lattice-matched with the InP substrate 1. The buffer layer 3 is formed of InAl(Ga)As, In(Ga, Al, As)P, or a heterojunction layer formed of InAl(Ga)As and In(Ga, Al, As)P. The buffer layer 3 is also formed using metal organic chemical vapor deposition (MOCVD), molecular beam epitaxy (MBE), or chemical beam epitaxy (CBE).

Figure 2:
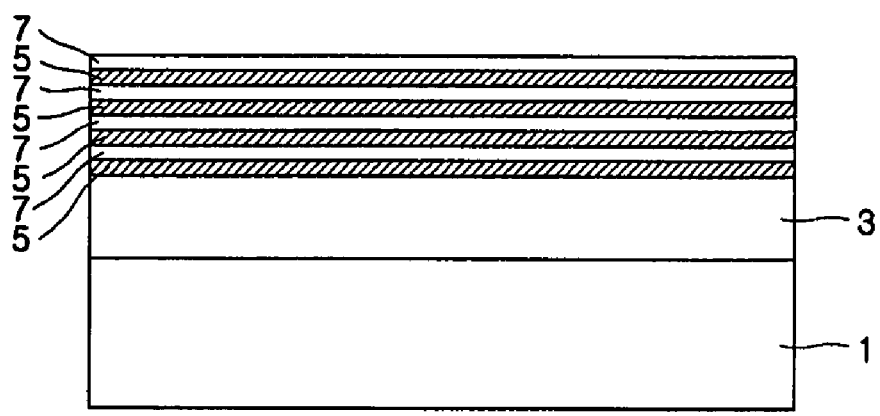

Referring to FIG. 2, In(Ga)As layers 5 and InAl(Ga)As layers 7 that are greatly lattice-mismatched are alternately deposited on the buffer layer 3. The In(Ga)As layers 5 and the InAl(Ga)As layers 7 are formed using MOCVD, MBE, or CBE. The In(Ga)As layers 5 and the InAl(Ga)As layers 7 are alternately deposited to a thickness between 1 monolayer and 10 monolayers. A cycle of alternating the In(Ga)As layers 5 and the InAl(Ga)As layers 7 is within a range between "10" and "100." For convenience, the cycle of the In(Ga)As layers 5 and the InAl(Ga)As layers 7 is expressed as "4" in FIG. 2.

Figure 3:
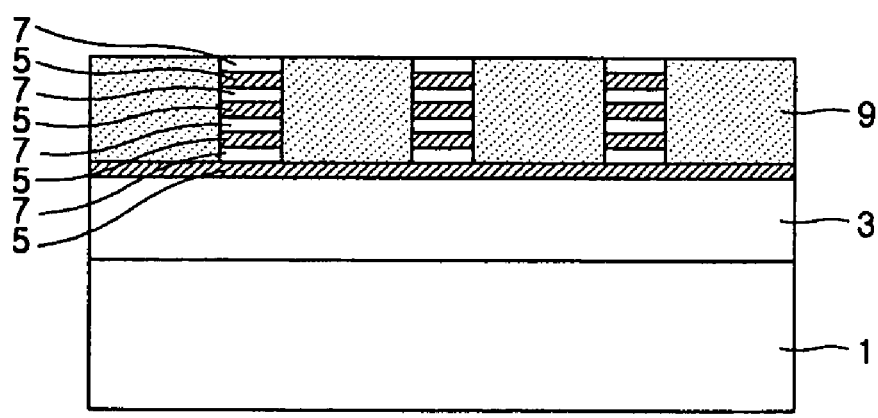

Referring to FIG. 3, when the In(Ga)As layers 5 and the InAl(Ga)As layers 7 are alternately deposited, In(Ga, Al)As quantum dots 9 are formed using a self assembled method using strain energy accumulated by the lattice-mismatch between the In(Ga)As layers 5 and the InAl(Ga)As layers 7 and a phase separation caused by a growth behavior of a III-group material for constituting the In(Ga)As layers 5 and the InAl(Ga)As layers 7.

The In(Ga, Al)As quantum dots 9 are formed on a portion of the buffer layer 3. The In(Ga, Al)As quantum dots 9 are formed using MOCVD, MBE, or CBE.

A process of forming the In(Ga, Al)As quantum dots 9 will now be described in more detail. When the In(Ga)As layers 5 and the InAl(Ga)As layers 7 are alternately deposited on the buffer layer 3, the self assembled method using the strain energy accumulated by the lattice-mismatch between the In(Ga)As layers 5 and the InAl(Ga)As layers 7 is a main factor of forming the initial In(Ga, Al)As quantum dots 9. When the initial In(Ga, Al)As quantum dots 9 are formed, the growth behavior of the III-group material around the initial In(Ga, Al)As quantum dots 9 affects the initial In(Ga, Al)As quantum dots 9. In other words, the phase separation caused by different growth behaviors of In, Ga, and Al such as diffusion lengths, speeds, and the like of In, Ga, and Al affects the initial In(Ga, Al)As quantum dots 9 so as to form the initial In(Ga, Al)As quantum dots 9.

In a case where In(Ga)As quantum dots are formed on a GaAs substrate as previously described in the prior art, a lattice-mismatch between the GaAs substrate and the In(Ga)As quantum dots is high. Thus, the In(Ga)As quantum dots can be grown using a self assembled method without an effect of a growth behavior of a III-group material. However, the InP substrate used in the present invention has a lower lattice-mismatch with a material for forming quantum dots, i.e., with In(Ga, Al)As, than the GaAs substrate. Thus, when In(Ga, Al)As quantum dots are formed, the In(Ga, Al)As quantum dots are greatly affected by the phase separation caused by the growth behavior of the III-group material. Moreover, In(Ga, Al)As is essentially a material in which a phase separation easily occurs. Thus, it is mostly impossible to form highly uniform In(Ga, Al)As quantum dots on the InP substrate.

To overcome this, the present inventors focus on using the phase separation not on removing the phase separation and forming In(Ga, Al)As quantum dots. In other words, the present inventors form highly uniform, high quality In(Ga, Al)As quantum dots using a self assembled method and a phase separation caused by the growth behavior of the III-group material.

Figure 4:
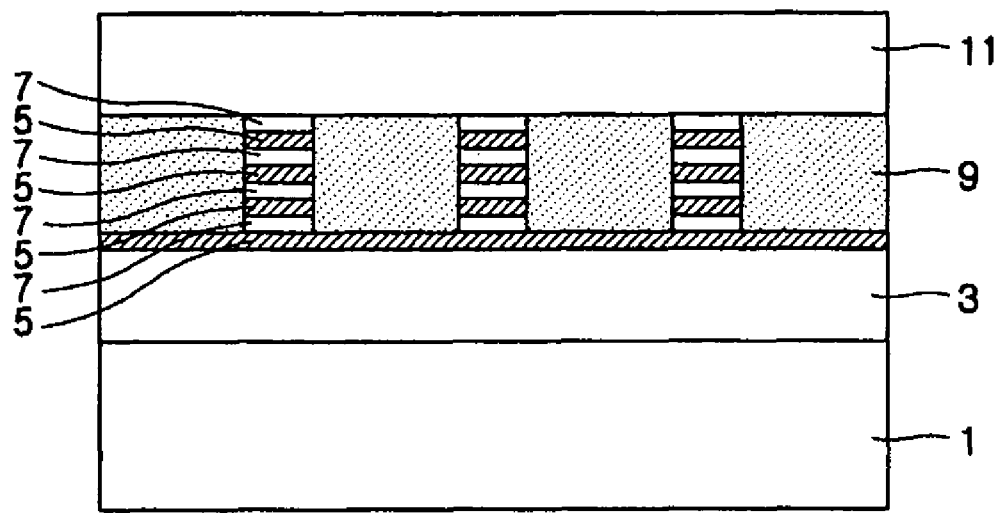

Referring to FIG. 4, a cap layer 11 is formed on the In(Ga, Al)As quantum dots 9 to complete quantum dot samples. The cap layer 11 is formed of InAl(Ga)As, In(Ga, Al, As)P, or a heterojunction layer formed of InAl(Ga)As and In(Ga, Al, As)P. The In(Ga, Al)As quantum dots 9 according to the present embodiment are formed using the self-assembled method and the phase separation caused by the alternate growth method as previously described.

The In(Ga, Al)As quantum dots 9 formed using the self assembled method and the phase separation caused by the alternate growth method are optimally circular and highly uniform. Thus, the quantum dot samples according to the present embodiment can decrease a FWHM of a photoluminescence peak and increase an intensity of the photoluminescence peak.

Figure 5:
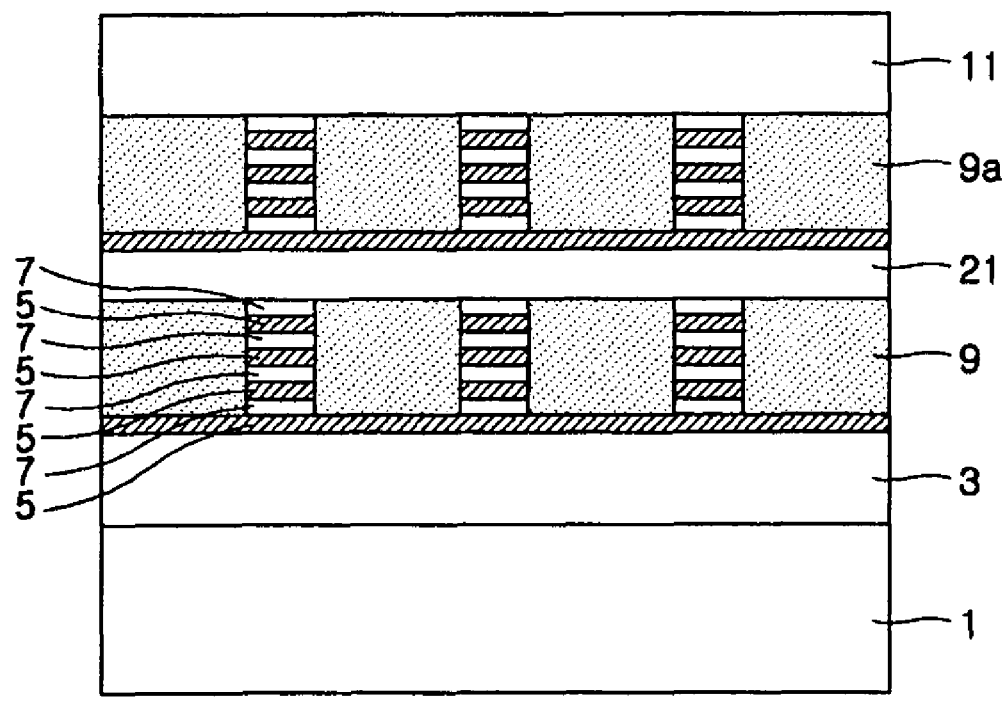
FIG. 5 is a cross-sectional view illustrating a method for forming quantum dots according to another embodiment of the present invention.

FIG. 5 is a cross-sectional view illustrating a method for forming quantum dots according to another embodiment of the present invention.

In detail, the method of the present embodiment is the same as that of the previous embodiment except that quantum dots are stacked a plurality of times. The same reference numerals of FIG. 5 as those of FIG. 4 denote like elements.

In more detail, processes as described in the previous embodiment with reference to FIGS. 1 through 3 are performed. As shown in FIG. 5 a barrier layer 21 is formed on In(Ga, Al)As quantum dots 9. The barrier layer 21 is formed of InAl(Ga)As, In(Ga, Al, As)P, or a heterojunction layer formed of InAl(Ga)As and In(Ga, Al, As)P.

In(Ga, Al)As quantum dots 9a are formed on the barrier layer 21 using the method described with reference to FIGS. 2 and 3. A barrier layer (not shown) is formed on the In(Ga, Al)As quantum dots 9a, and then In(Ga, Al)As quantum dots (not shown) are formed on the barrier layer. The barrier layer 21 and the In(Ga, Al)As quantum dots 9a are stacked a plurality of times. The stacking cycle is within a range between "1" and "30." For convenience, the stacking cycle is "2" in FIG. 5.

After the In(Ga, Al)As quantum dots 9a are formed, a cap layer 11 is formed to complete quantum dot samples as in the previous embodiment.

FIGS. 6 through 9 are cross-sectional views illustrating a method for forming quantum dots according to still another embodiment of the present invention.

In detail, the method according to the present embodiment is different from the method according to the first embodiment in that different materials are alternately deposited and thus a principle and a material for forming quantum dots are different.

Figure 6:
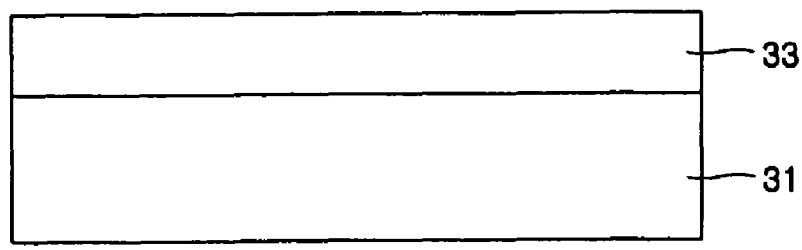
FIGS. 6 through 9 are cross-sectional views illustrating a method for forming quantum dots according to still another embodiment of the present invention.

Referring to FIG. 6, an InP substrate 31 is annealed in an atmosphere of arsenic (As). A buffer layer 33 is formed on the InP substrate 31 so as to be lattice-matched with the InP substrate 31. The buffer layer 33 is formed of InAl(Ga)As, In(Ga, Al, As)P, or a heterojunction layer formed of InAl(Ga)As, In(Ga, Al, As)P. The buffer layer 33 is formed using MOCVD, MBE, or CBE.

Figure 7:
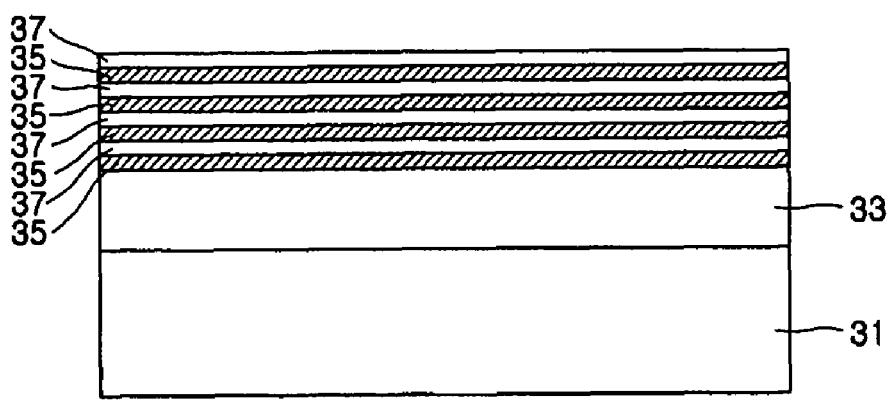

Referring to FIG. 7, In(Ga)As layers 35 and In(Ga, Al.As)P layers 37 that are greatly lattice-mismatched with each other are sequentially alternately deposited on the buffer layer 33. The In(Ga)As layers 35 and the In(Ga, Al.As)P layers 37 are formed using MOCVD, MBE, or CBE.

The In(Ga)As layers 35 and the In(Ga, Al.As)P layers 37 are alternately deposited to a thickness between 1 monolayer and 10 monolayers. A cycle of alternating the In(Ga)As layers 35 and the In(Ga, Al.As)P layers 37 is within a range between "10" and "100." For convenience, the cycle is expressed as "4" in FIG. 7.

Figure 8:
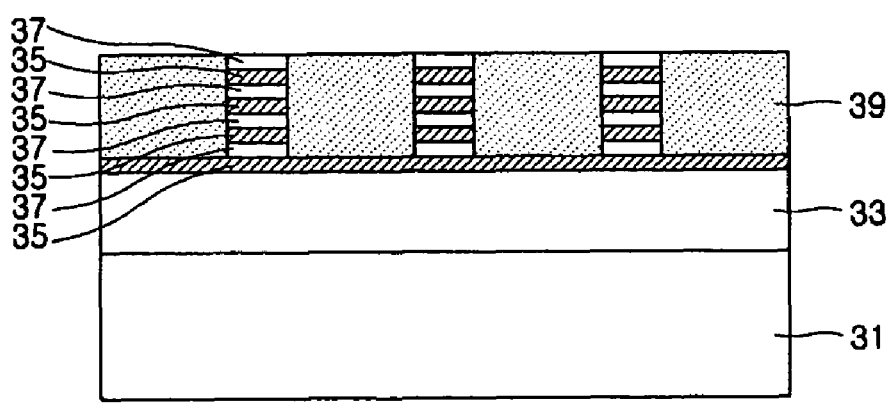

Referring to FIG. 8, when the In(Ga)As layers 35 and the In(Ga, Al.As)P layers 37 are alternately deposited, In(Ga, Al, P)As quantum dots 39 are formed using a self assembled method using strain energy accumulated by the lattice-mismatch between the In(Ga)As layers 35 and the In(Ga, Al.As)P layers 37 and the alternate deposition of the In(Ga)As layers 35 and the In(Ga, Al.As)P layers 37.

The In(Ga, Al, P)As quantum dots 39 are formed on a portion of the buffer layer 33. The In(Ga, Al, P)As quantum dots 39 are formed using MOCVD, MBE, or CBE.

Figure 9:
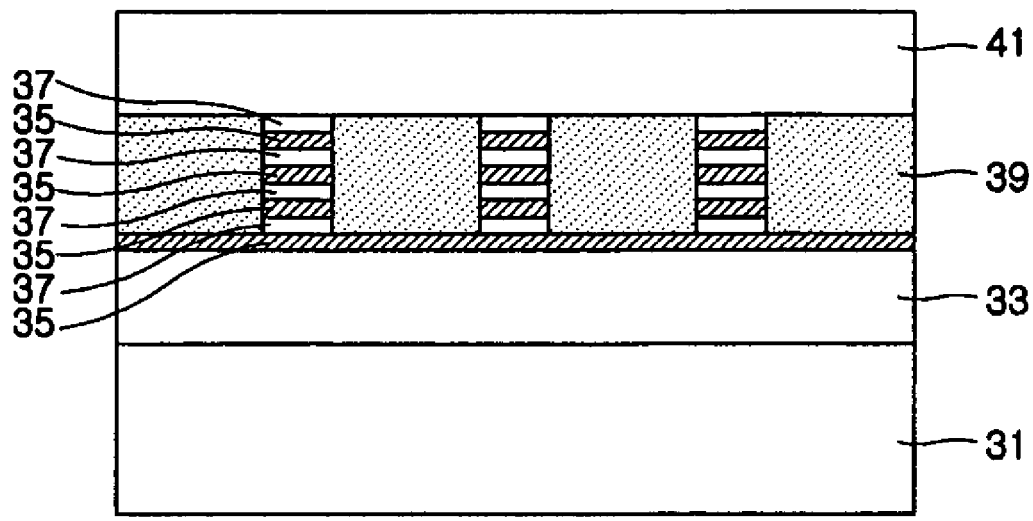

Referring to FIG. 9, a cap layer 41 is formed on the In(Ga, Al, P)As quantum dots 39 to complete quantum dot samples. The cap layer 41 is formed of InAl(Ga)As, In(Ga, Al, As)P, or a heterojunction layer formed of InAl(Ga)As and In(Ga, Al, As)P. The In(Ga, Al, P)As quantum dots 39 of the present embodiment formed by the self assembled method and the alternate growth method are optimally circular and highly uniform as will be described later. Thus, the quantum dot samples according to the present embodiment can decrease a FWHM of a photoluminescence peak and increase an intensity of the photoluminescence peak.

Figure 10:
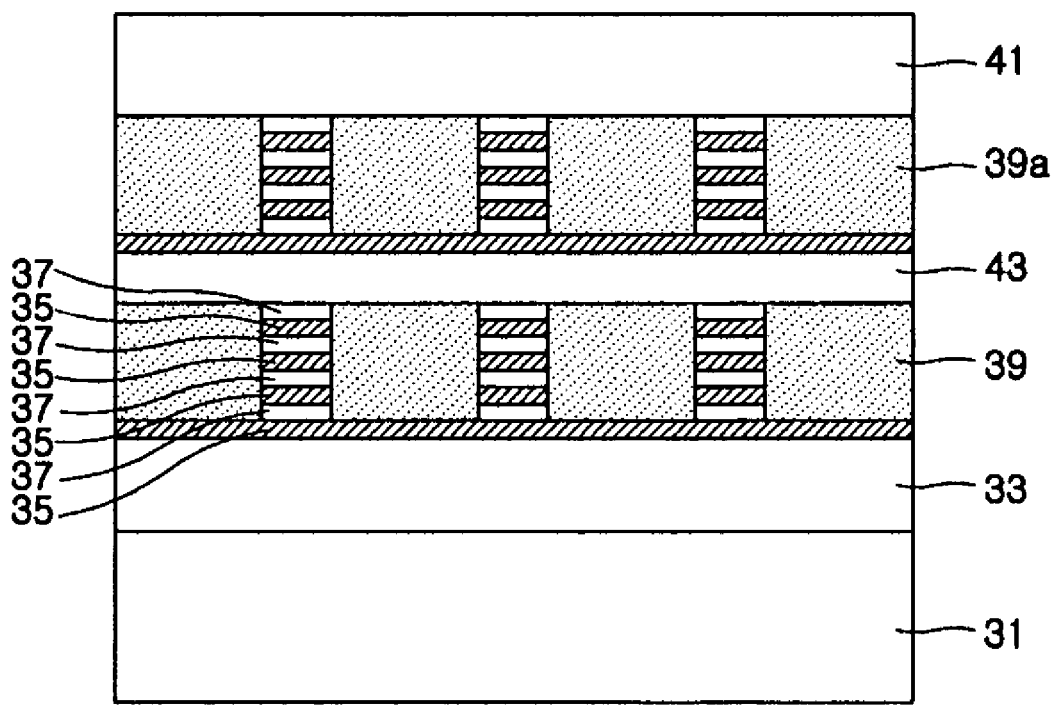
FIG. 10 is a cross-sectional view illustrating a method for forming quantum dots according to yet another embodiment of the present invention.

FIG. 10 is a cross-sectional view illustrating a method for forming quantum dots according to yet another embodiment of the present invention.

In detail, the method of the present embodiment is the same as that of the previous embodiment except that quantum dots are stacked a plurality of times. The same reference numerals of FIG. 10 as those of FIGS. 6 through 9 denote like elements.

In more detail, processes as described in the previous embodiment with reference to FIGS. 6 through 8 are performed. A barrier layer 43 is formed on In(Ga, Al, P)As quantum dots 39. The barrier layer 43 is formed of InAl(Ga)As, In(Ga, Al, As)P, or a heterojunction layer formed of InAl(Ga)As and In(Ga, Al, As)P.

In(Ga, Al)As quantum dots 39a are formed on the barrier layer 43 using a self assembled method and an alternate growth method as described with reference to FIGS. 7 and 8. A barrier layer (not shown) is formed on the In(Ga, Al)As or In(Ga, Al, P)As quantum dots 39a or 39, and then In(Ga, Al)As or In(Ga, Al, P)As quantum dots (not shown) are formed on the barrier layer. The barrier layer 43 and the In(Ga, Al)As or In(Ga, Al, P)As quantum dots 39 are stacked a plurality of times. The stacking cycle may be within a range between "1" and "30." For convenience, the stacking cycle is expressed as "2" in FIG. 10.

After the In(Ga, Al, P)As quantum dots 39 are formed, a cap layer 41 is formed to complete quantum dots as in the previous embodiment. The cap layer 41 is formed of InAl(Ga)As, In(Ga, Al, As)P, or a heterojunction layer formed of InAl(Ga)As and In(Ga, Al, As)P.

Figure 11:
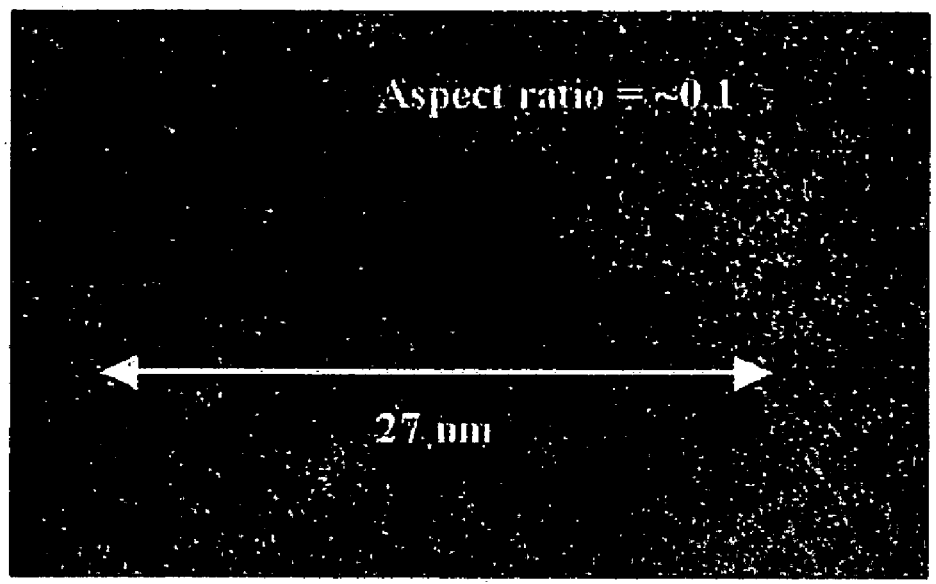
FIG. 11 is a transmission electron micrograph (TEM) illustrating a cross-section quantum dot samples formed using a conventional self-assembled method.
Figure 12:
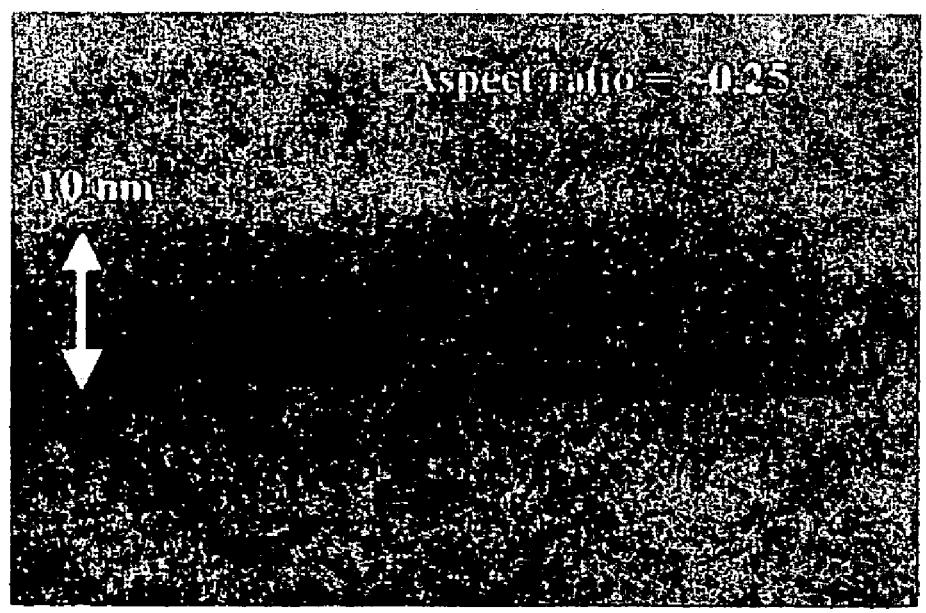
FIG. 12 is a TEM illustrating a cross-section of quantum dot samples formed using an alternate growth method according to the present invention.

FIG. 11 is a TEM illustrating a cross-section of quantum dot samples formed by the conventional self assembled method, and FIG. 12 is a TEM illustrating a cross-section of quantum dot samples formed by the alternate growth method of the present invention.

In detail, as shown in FIG. 11, heights of the quantum dot samples formed by the conventional self assembled method is relatively lower than widths of the quantum dot samples. In other words, an aspect ratio of the quantum dot samples formed by the conventional self-assembled method is about "0.1." The quantum dot samples according to the present invention have an aspect ratio of about "0.25" that is more greatly increased than that of the conventional quantum dot samples. As described above, if an aspect ratio is great, quantum dots are circular or symmetric and thus optimum.

Figure 13:
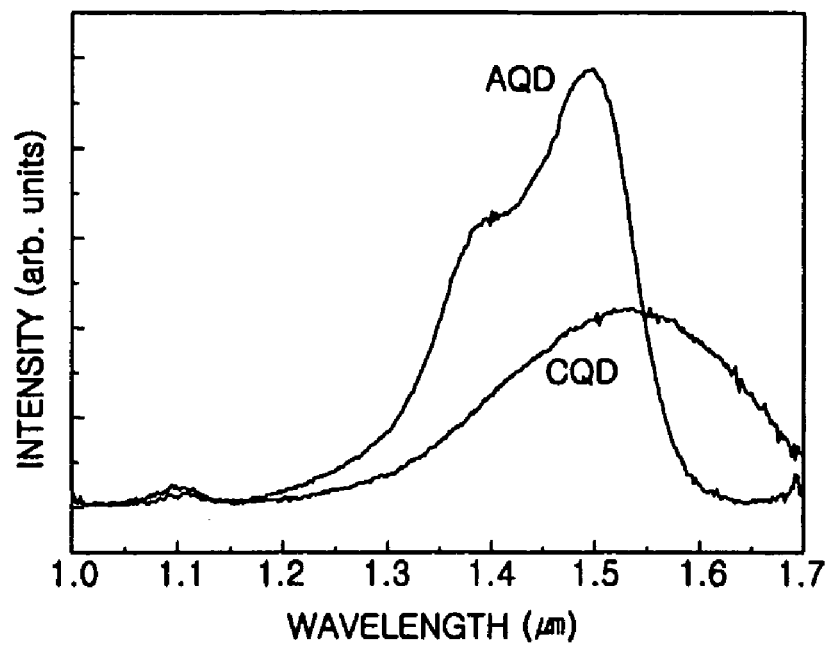
FIG. 13 is a graph illustrating ambient temperature photoluminescence characteristics of quantum dot samples formed using a conventional self assembled method and an alternate growth method of the present invention, with respect to a wavelength.

FIG. 13 is a graph illustrating ambient temperature photoluminescence characteristics of the quantum dot samples formed by the conventional self assembled method and the alternate growth method of the present invention, with respect to a wavelength.

In detail, FIG. 13 illustrates photoluminescence peaks of quantum dot samples CQD formed by the conventional self assembled method and quantum dot samples AQD formed by the alternate growth method of the present invention. As shown in FIG. 13, the quantum dot samples AQD have higher uniformity, and lower FWHM, and higher intensity of a photoluminescence peak than the quantum dot samples CQD.

Figure 14:
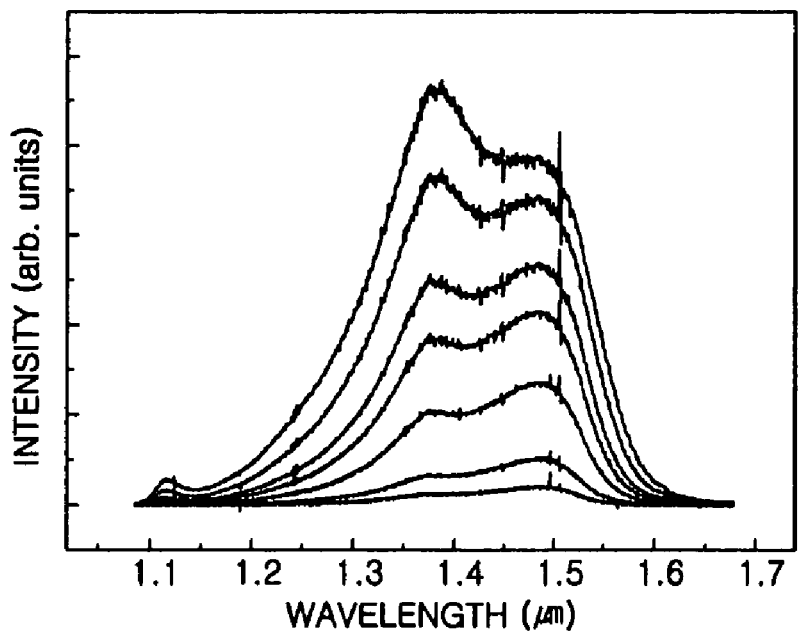
FIG. 14 is a graph illustrating an ambient temperature photoluminescence characteristic of quantum dot samples formed using an alternate growth method of the present invention depending on an excitation intensity, with respect to a wavelength.

FIG. 14 is a graph illustrating ambient temperature photoluminescence characteristics of the quantum dot samples formed by the alternate growth method of the present invention depending on an excitation intensity, with respect to a wavelength.

In detail, as shown in FIG. 14, excitation intensities of upper photoluminescence peaks are great. An intensity of a photoluminescence peak of a short wavelength is gradually increased with an increase in the excitation intensity and thus become greater than an intensity of photoluminescence peak of a long wavelength. The photoluminescence peak of the short wavelength is caused by a first excitation level, and thus high-quality quantum dots can be formed according to the present invention. In other words, if a photoluminescence peak easily occurs due to the first excitation level, optimally shaped quantum dots are formed according to the present invention.

As described above, in a method for quantum dots by an alternate growth process according to the present invention, a buffer layer can be formed on an InP substrate so as to be lattice-matched with the InP substrate. Also, In(Ga)As layers and InAl(Ga)As layers or In(Ga, Al, As)P layers that are greatly latticed-mismatched with each other can be sequentially alternately deposited on the buffer layer. As a result, In(Ga, Al)As or In(Ga, Al, P)As quantum dots can be formed.

The method of the present invention adopts a self-assembled method caused by a lattice-mismatch and an alternate growth method so as to quantum dots having optimum shapes. Thus, quantum dot samples formed according to the present invention have high uniformity, and thus a FWHM of a photoluminescence peak can be decreased and an intensity of the photoluminescence peak can be remarkably increased. As a result, when the quantum dots formed according to the present invention are used as an active layer of a photonic device such as a photoluminescence device, a photodetector, or the like, a characteristic of the photonic device can be greatly improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method for forming quantum dots, comprising:
    forming a buffer layer on an InP substrate so as to be lattice-matched with the InP substrate;
    sequentially alternately depositing a first layer formed of an In(Ga)As layer and a second layer formed of an InAl(Ga)As or In(Ga, Al, As)P layer, the first and second layers being greatly lattice-mismatched with each other, on the buffer layer; and
    forming a singular layer of In(Ga, Al)As or In(Ga, Al, P)As quantum dots, the quantum dots being formed from a combination of the first and second layers.

2. The method of claim 1, wherein the buffer layer is formed of one of InAl(Ga)As, In(Ga, Al, As)P, a heterojunction layer formed of InAl(Ga)As and In(Ga, Al, As)P.

3. The method of claim 1, wherein the In(Ga)As layers and the InAl(Ga)As or In(Ga, Al, As)P layers are alternately deposited to a thickness between 1 monolayer and 10 monolayers.

4. The method of claim 1, wherein a cycle of alternating the In(Ga)As layers and the InAl(Ga)As or In(Ga, Al, As)P layers is with in a range between "10" and "100."

5. The method of claim 1, wherein the In(Ga, Al)As or In(Ga, Al, P)As quantum dots are formed of one of metal organic chemical vapor deposition, molecular beam epitaxy, and chemical beam epitaxy.

6. The method of claim 1, further comprising: forming a barrier layer on the In(Ga, Al)As or In(Ga, Al, P)As quantum dots and further forming quantum dots using the alternate growth method, wherein a cycle of stacking the barrier layer and the quantum dots is within a range between "1" and "30."

7. The method of claim 6, wherein the barrier layer is formed of one of InAl(Ga)As, In(Ga, Al, As)P, and a heterojunction layer formed of InAl(Ga)As and In(Ga, Al, As)P.

8. A method for forming quantum dots, comprising:
    forming a buffer layer on a InP substrate so as to be lattice-matched with the InP substrate;
    sequentially alternately depositing a first layer formed of an In(Ga)As layer and a second layer formed of an InAl(Ga)As layer that are greatly lattice-mismatched with each other on the buffer layer; and
    forming a singular layer of In(Ga, Al)As quantum dots, the quantum dots being formed from a combination of the first and second layers.

9. The method of claim 8, wherein the buffer layer is formed of one of InAl(Ga)As, In(Ga, Al, As)P, and a heterojunction layer formed of InAl(Ga)As and In(Ga, Al, As)P.

10. The method of claim 8, wherein the In(Ga)As layers and the InAl(Ga)As layers are alternately deposited to a thickness between 1 monolayer and 10 monolayers.

11. The method of claim 8, wherein a cycle of alternating the In(Ga)As layers and the InAl(Ga)As layers is within a range between "10" and "100."

12. A method for forming quantum dots, comprising:
    forming a buffer layer on an InP substrate so as to be lattice-matched with the InP substrate;
    sequentially alternately depositing a first layer of an In(Ga)As layer and a second layer formed of an In(Ga, Al, As)P layer, the first and second layers being greatly lattice-mismatched with each other, on the buffer layer; and
    forming a singular layer of In(Ga, Al, P)As quantum dots, the quantum dots being formed from a combination of the first and second layers.

13. The method of claim 12, wherein the buffer layer is formed of one of InAl(Ga)As, In(Ga, Al, As)P, and a heterojunction layer formed of InAl(Ga)As and In(Ga, Al, As)P.

14. The method of claim 12, wherein the In(Ga)As layers and the In(Ga, Al, As)P layers are alternately deposited to thickness between 1 monolayer and 10 monolayers.

15. The method of claim 12, wherein a cycle of alternating the In(Ga)As layers and the In(Ga, Al, As)P layers is within a range between "10" and "100."

16. A method for forming quantum dots, comprising:
    forming a buffer layer on an InP substrate so as to be lattice-matched with the InP substrate;
    sequentially alternately depositing a first layer formed of an In(Ga)As layer and a second layer formed of an InAl(Ga)As layer that are greatly lattice-mismatched with each other on the buffer layer; and
    forming a singular layer of In(Ga, Al)As quantum dots using a self assembled method using the lattice-mismatch between the In(Ga)As layers and the InAl(Ga)As layers and a phase separation caused by a growth behavior of a III-group material for constituting the In(Ga)As layers and the InAl(Ga)As layers, the quantum dots being formed from a combination of the first and second layers.

17. The method of claim 16, wherein the buffer layer is formed of one of InAl(Ga)As, In(Ga, Al, As)P, and a heterojunction layer formed of InAl(Ga)As and In(Ga, Al, As)P.

18. The method of claim 16, wherein the In(Ga)As layers and the InAl(Ga)As layers are alternately deposited to a thickness between 1 monolayer and 10 monolayers.

19. The method of claim 16, wherein a cycle of alternating the In(Ga)As layers and the InAl(Ga)As layers is within a range between "10" and "100."

20. A method for forming quantum dots, comprising:
    forming a buffer layer on an InP substrate so as to be lattice-matched with the InP substrate; and
    sequentially alternately depositing a first layer formed of an In(Ga)As layer and a second layer formed of an In(Ga, Al, As)P, the first and second layers being greatly lattice-mismatched with each other, on the buffer layer; and
    forming a singular layer of In(Ga, Al)As quantum dots using a self assembled method using the lattice-mismatch between the In(Ga, As, layers and the In(Ga, Al, As)P layers and an alternate growth method, the quantum dots being formed from a combination of the first and second layers.

21. The method of claim 20, wherein the buffer layer is formed of one of InAl(Ga)As, In(Ga, Al, As)P, and a heterojunction layer formed of InAl(Ga)As and In(Ga, Al, As)P.

22. The method of claim 20, wherein the In(Ga)As layers and the In(Ga, Al, As)P layers are alternately deposited to a thickness between 1 monolayers and 10 monolayers.

23. The method of claim 20, wherein a cycle of alternating the In(Ga)As layers and the In(Ga, Al, As) P layers is within a range between "10" and "100."

* * * * *